United States Patent [19]

Yokoyama

[11] Patent Number: 4,847,572

[45] Date of Patent: Jul. 11, 1989

[54] ELECTRONIC TUNING CIRCUIT FOR AM RECEIVER

[75] Inventor: Hajime Yokoyama, Saitama, Japan

[73] Assignee: Toko, Inc., Tokyo, Japan

[21] Appl. No.: 113,519

[22] Filed: Oct. 28, 1987

[30] Foreign Application Priority Data

Oct. 30, 1986 [JP] Japan .................................. 61-259406
Feb. 27, 1987 [JP] Japan .................................. 62-45039

[51] Int. Cl.$^4$ .............................................. H03B 5/08
[52] U.S. Cl. ................................... 331/177 V; 331/167;
334/15; 455/262; 455/318
[58] Field of Search ............ 331/36 C, 177 V, 117 R,
331/167; 455/262, 264, 318; 334/15

[56] References Cited

U.S. PATENT DOCUMENTS 3,959,728  5/1976  Yamazaki et al. .......... 3341/36 C X
4,593,255  6/1986  Matsuura ..................... 331/177 V X

FOREIGN PATENT DOCUMENTS 1319107  1/1963  France ......................... 331/177 V
55-34549  3/1980  Japan ........................... 331/177 V Primary Examiner—Siegfried H. Grimm

[57] ABSTRACT

In an electronic tuning circuit for AM receiver including a radio-frequency tuning circuit and local oscillator circuit each using a variable capacitance diode, the local oscillator circuit comprises an oscillation coil; a padding capacitor connected in series with the oscillation coil; a first variable capacitance diode connected at one end in series with the oscillation coil; a first and a second fixed capacitor connected at one end in series with each other; and a second variable capacitance diode connected in parallel with the second fixed capacitor. The second fixed capacitor has its other end connected to a connection point between the padding capacitor and the first variable capacitance diode. The first fixed capacitor has its other end connected to the connection point between the oscillation coil and one end of the first variable capacitance diode. A tuning voltage is applied to the first and second variable capacitance diodes, thereby reducing tracking error over the entire receiving frequency band.

6 Claims, 3 Drawing Sheets

ELECTRONIC TUNING CIRCUIT FOR AM RECEIVER

BACKGROUND OF THE INVENTION

1. Field of the Invention:

This invention relates to an electronic tuning circuit for an AM radio receiver including a radio-frequency tuning circuit and a local oscillator circuit wherein a variable capacitance diode is used as a tuning element, whereby tracking error is reduced.

2. Description of the Prior Art:

In order to have a better understanding of the present invention, description will first be made with reference to FIG. 1, wherein there is shown a conventional electronic tuning circuit for an AM receiver, which includes a radio-frequency tuning circuit 10 and a local oscillator circuit 20. A tuning voltage $V_T$ which is derived from a variable voltage source 40 on the basis of a PLL synthesizer system or the like, is applied to the radio-frequency tuning circuit 10 and local oscillator circuit 20 through resistors $R_{10}$ and $R_{11}$ respectively so that tuning to a desired frequency is achieved. The radio-frequency tuning circuit 10 comprises a tuning coil $L_{10}$; a trimmer capacitor $C_{10}$ and capacitor $C_{S10}$ which are connected in parallel with the tuning coil $L_{10}$; a capacitor $CP_{10}$ connected at one end to a connection point between the tuning coil $L_{10}$; the trimmer capacitor $C_{10}$ and the capacitor $C_{S10}$; and a variable capacitance diode $D_{10}$ connected to the opposite end of the capacitor $C_{10l}$. The local oscillator circuit 20 comprises an oscillation coil $L_{11}$; a padding capacitor $CP_{11}$ connected to one end of the oscillation coil $L_{11}$; and a trimmer capacitor $C_{11}$, capacitor $C_{S11}$ and variable capacitor diode $D_{11}$ which are connected in parallel with each other between the other ends of the padding capacitor $CP_{11}$ and oscillation coil $L_{11}$.

With an AM receiver, it has been the usual practice that tracking adjustment is carried out by adjusting the capacitance of the trimmer capacitors C10, C11 and the inductance of the coils L10, L11 of the electronic tuning circuit after the components of the electronic tuning circuit have been individually mounted onto a printed circuit board, together with other units such as amplifiers and so forth. However, such a procedure is disadvantageous in that tracking errors tend to occur inevitably from a theoretical point of view. More specifically, with a superheterodyne receiver, its local oscillator circuit is arranged to produce oscillation at a frequency which is higher than the receiving frequency by an amount equal to the intermediate frequency (450 KHz). Thus, to receive a signal of a frequency in the medium wave (MW) band (522 KHz to 2079 KHz), it is required that the frequency of oscillation produced at the local oscillator circuit be varied in the range from 972 KHz to 1629 KHz. A comparison of the frequency variation ratios indicates that the frequency variation ratio $A_1$ of the radio-frequency tuning circuit 10 is given as follows:

$$A1 = \frac{1629}{522} = 3.12 \tag{1}$$

and that the frequency variation ratio $A_2$ of the local oscillator circuit 20 is given as follows:

$$A2 = \frac{2079}{972} = 2.14 \tag{2}$$

From the equations (1) and (2), it will be seen that the frequency variation ratio of the local oscillator circuit 20 is different from and lower than that of the radio-frequency tuning circuit 10. Usually, the variable capacitance diodes employed with the radio-frequency tuning circuit 10 and local oscillator circuit 20 are of an equal capacitance. Thus, difficulties have been experienced in an attempt to reduce tracking errors due to the fact that the frequency variation ratios of the radio tuning circuit 10 and local oscillator circuit 20 do not conform to each other for the reason mentioned above.

Referring now to FIG. 7, curve (a) shows tracking error which tends to occur when the padding capacitor $CP_{11}$ is removed from the local oscillator circuit 20 of FIG. 1; curve (b) indicates tracking error which tends to occur when the local oscillator circuit 20 comprises the oscillation coil $L_{11}$, variable capacitance diode $D_{11}$ and padding capacitor $CP_{11}$; and curve (c), which corresponds to a combination of the curves (a) and (b), represents tracking error which tends to occur with the conventional electronic tuning circuit.

With the conventional AM receiver, it has been usual practice to perform tracking adjustment after electronic components have been mounted onto a printed circuit board. Thus, at the final adjustment step, it may happen that tracking error goes beyond the control limits. If that happens, then all the components mounted on the printed circuit board must be discarded, or alternatively, the defective component or components must be replaced, and tracking adjustment must again be performed. Obviously, such a conventional arrangement is disadvantageous in that too many components are used for performing tracking adjustment so that too many adjustment steps are involved, which leads to an increase in the manufacturing cost.

Furthermore, with the conventional arrangement of AM receiver, even if tracking adjustment has been performed, tracking error occurs theoretically in the range of 3 KHz to 10 KHz; thus, such a conventional arrangement is not applicable to an AM stereo receiver in which it is required that tracking error be reduced over a wide frequency range. The use of the conventional electronic tuning circuit with AM stereo receiver is disadvantageous in that it results in poor stereo separation so that distortion is caused.

SUMMARY OF THE INVENTION

Accordingly, it is an object of the present invention to provide a novel and improved electronic tuning circuit for AM receiver, which is designed so that tracking error is reduced over a wide frequency range such as 500 KHz to 1700 KHz.

Another object of the present invention is to provide an electronic tuning circuit for AM receiver, wherein the number of positions where tracking adjustment is to be effected, is reduced to such an extent that procedures for tracking adjustment are substantially eliminated.

Still another object of the present invention is to provide an electronic tuning circuit for AM receiver, which includes a local oscillator circuit comprising a bias circuit with reduced stray capacitance.

The present invention has been made with a view to achieving the foregoing objects, and according to the present invention, there is provided a preset type electronic tuning circuit for AM receiver including a radio-frequency tuning circuit and a local oscillator circuit, wherein said local oscillator circuit comprises an oscillation coil, a padding capacitor connected in series with the oscillation coil, a first variable capacitance diode connected in series with the oscillation coil; a first and a second fixed capacitor connected at one end in series with each other; and a second variable capacitance diode connected in parallel with the second fixed capacitor. The second fixed capacitor has the other end thereof connected to a connection point between the padding capacitor and the first variable capacitance diode. The first fixed capacitor has the other end thereof connected to the connection point between the oscillation coil and the one end of the first variable capacitance diode. A tuning voltage is applied to the first and second variable capacitance diodes, thereby reducing tracking error over the entire receiving frequency band.

Other objects, features and advantages of the present invention will become apparent from the ensuring description taken in conjunction with the accompanying drawings.

DESCRIPTION OF THE PREFERRED EMBODIMENTS

With reference to FIGS. 2 to 7, description will now be made of the electronic tuning circuit for AM receiver according to the present invention.

Figure 1:
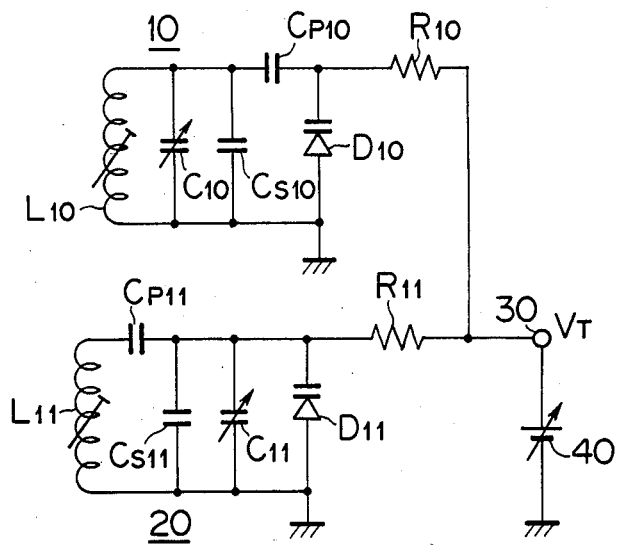
FIG. 1 is a circuit diagram showing a conventional electronic tuning circuit for AM receiver.
Figure 2:
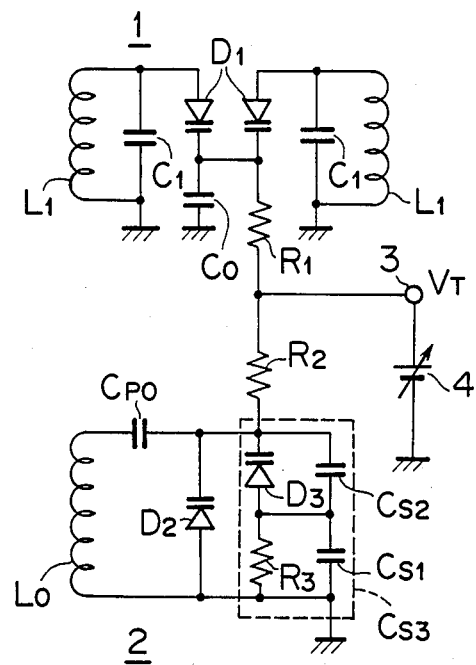
FIG. 2 is a circuit diagram showing the electronic tuning circuit for AM receiver according to an embodiment of the present invention.

Referring to FIG. 2, there is shown the electronic tuning circuit according to a first embodiment of the present invention, which comprises a radio-frequency tuning circuit shown generally at 1, and a local oscillator circuit shown generally at 2. The radio-frequency tuning circuit 1 includes dual tuning circuits each comprising a tuning coil $L_1$; a capacitor $C_1$ connected in parallel with the tuning coil $L_1$; and a variable capacitance diode $D_1$ connected to the connection point between the tuning coil $L_1$ and the capacitor $D_1$, wherein the variable capacitance diodes $D_1$ have their cathodes connected together and a variable voltage source 4 provides a tuning voltage $V_T$ to the cathode of each of the diodes through a resistor $R_1$. The local oscillator circuit 2 comprises a local oscillation coil $L_0$; a padding capacitor $C_{P0}$ connected to one end of the local oscillation coil $L_0$; a variable capacitance diode $D_2$ connected between the other end of the padding capacitor $C_{P0}$ and ground; and a variable capacitance diode $D_3$ and capacitor $C_{S2}$ connected in parallel with each other and to the connection point between variable capacitance diode $D_2$ and the padding capacitor $C_{P0}$; a capacitor $C_{S1}$ connected in series with the capacitor $C_{S2}$; and a bias resistor $R_3$ through which the variable capacitance diode $D_3$ is grounded. The radio-frequency tuning circuit 1 and local oscillator circuit 2 are provided with the tuning voltage $V_T$ from the variable voltage source 4 through the resistor $R_1$ and a resistor $R_2$ respectively. The variable voltage source 4 is commonly arranged to provide a predetermined tuning voltage $V_T$ under the control of progam signal through a PLL synthesizer circuit.

Figure 3:
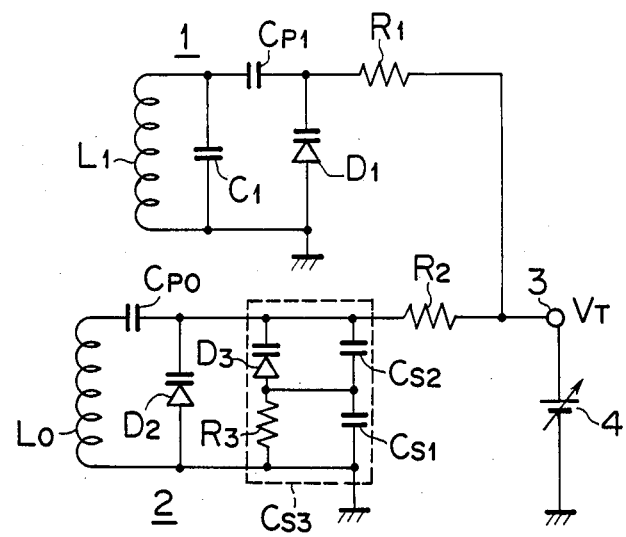
FIG. 3 is a circuit diagram showing the electronic tuning circuit for AM receiver according to a second embodiment of the present invention.

Referring to FIG. 3, there is shown the electronic tuning circuit for AM receiver according to a second embodiment of the present invention, including a radio-frequency tuning circuit 1 which is different from that of FIG. 2 in that a tuning capacitor $C_1$ is connected in parallel with a tuning coil $L_1$; a capacitor $C_{P1}$ is connected to one connection point between the tuning coil $L_1$ and the tuning capacitor $C_1$; and a variable capacitance diode $D_1$ is connected between the other end of the capacitor $C_{P1}$ and the ground. As will be appreciated from the FIG. 3, the radio-frequency tuning circuit 1 is by no means limited to the arrangement shown in FIG. 2 but may be modified as desired.

Figure 4:
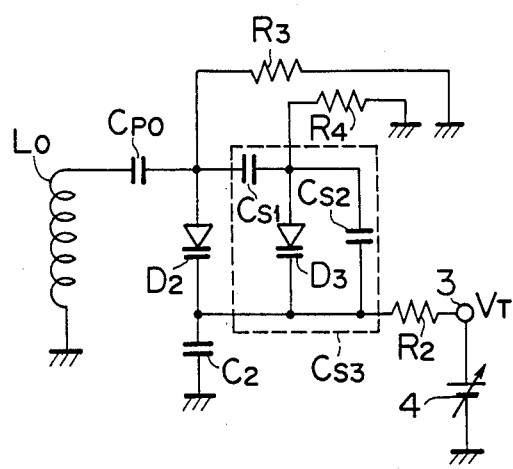
FIG. 4 is a circuit diagram showing another example of a local oscillator circuit included in the electronic tuning circuit for AM receiver according to the present invention.
Figure 5:
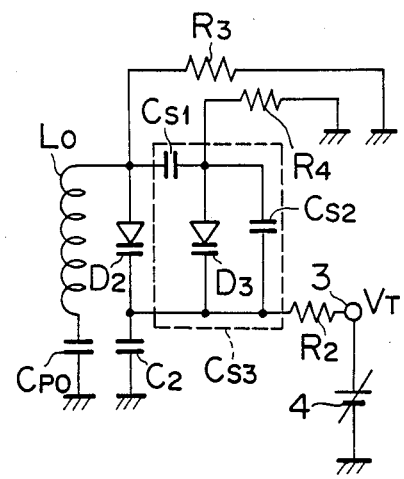
FIG. 5 is a circuit diagram showing a further example of local oscillator circuit included in the electronic tuning circuit for AM receiver according to the present invention.
Figure 6:
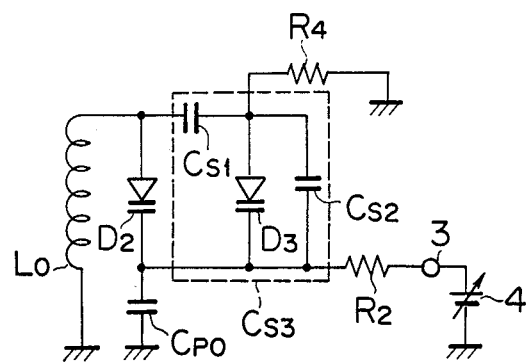
FIG. 6 is a circuit diagram showing a still further example of a local oscillator circuit included in the electronic tuning circuit for AM receiver according to the present invention.

FIGS. 4 to 6 illustrate circuit arrangements each of which is designed to reduce stray capacitance which occurs in the local oscillator control 2. In the embodiment shown in FIG. 4, a oscillation coil $L_0$ is grounded at one end; a padding capacitor $C_{P0}$ is connected to the oscillation coil $L_0$; a variable capacitance diode $D_2$ and capacitor $C_{S1}$ are connected to the other end of the padding capacitor $C_{P0}$; and a variable capacitance diode $D_3$ and capacitor $C_{S2}$ are connected in parallel with each other and between the other end of the capacitor $C_{S1}$ and the cathode of the variable capacitance diode $D_2$, wherein the cathode of the variable capacitance diode $D_3$ and one of the capacitor $C_{S2}$ are AC-wise grounded through a capacitor $C_2$, and a tuning voltage $V_T$ is applied to the connection point between the the diodes $D_2$, $D_3$ and the capacitor $C_{S2}$ through a resistor $R_2$. Resistors $R_3$ and $R_4$ serves as bias resistors.

The embodiment of FIG. 5 is similar to that of FIG. 4 except that an oscillation coil $L_0$ is grounded through a padding capacitor $C_{P0}$.

The embodiments of FIG. 6 is different from that of FIG. 5 in that a by-pass capacitor $C_2$ provided in FIG. 5 is made to serve as padding capacitor as well so that the number of the components is reduced.

According to each of the embodiments shown in FIGS. 4 to 6, the bias resistors $R_3$ and $R_4$ for the variable capacitance diodes $D_2$ and $D_3$ are connected in series with the local oscillator circuit so that stray capacitances which tend to occur across the terminals of the bias resistors $R_3$ and $R_4$ are prevented from being connected in parallel with the oscillation coil. With such arrangements, by reducing occurrence of stray capacitances which constitute indefinite elements in the circuit, the component constants for the circuit can be readily set up, and thus the characteristics are designed can readily be achieved.

Figure 7:
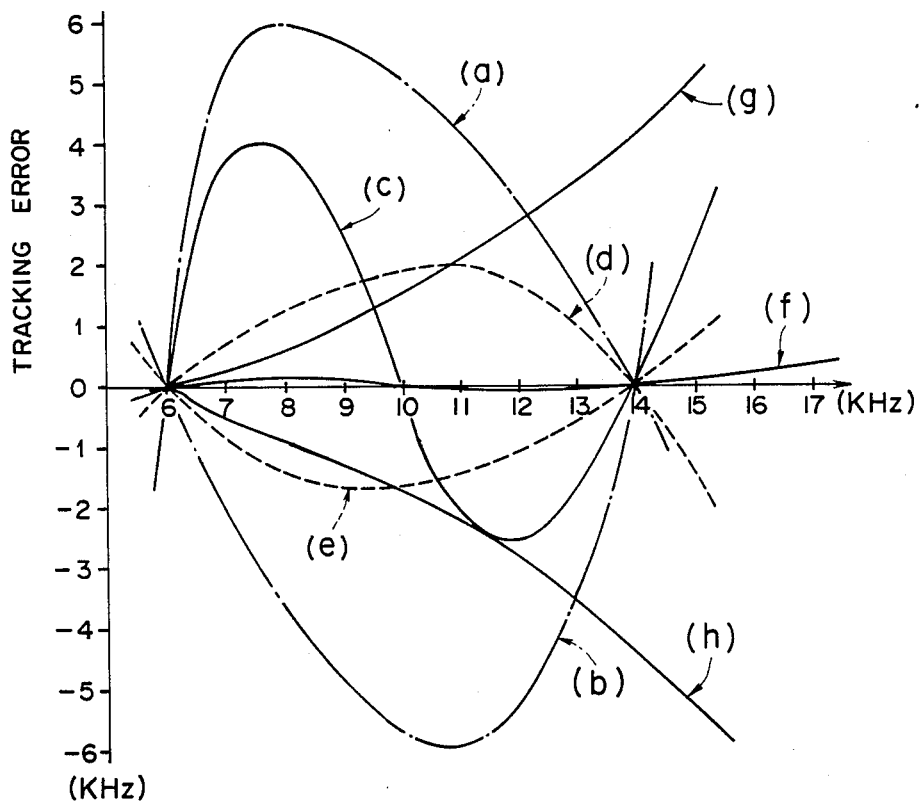
FIG. 7 is a view useful for explaining by comparison tracking errors of the electronic tuning circuit according to the present invention and those of the conventional electronic tuning circuit.

As will be seen from FIG. 7, the electronic tuning circuit for AM receiver according to the present invention is arranged to make substantially zero the tracking error over the entire receiving frequency band which is divided into three regions, instead of making zero the tracking error at three particular points in the receiving frequency band.

The present invention has been made in the view of the fact that a low receiving frequency is influenced more by a capacitor connected in series with the oscillation coil of the local oscillator circuit than by a capacitor connected in parallel therewith. The capacitor $C_{S2}$ connected in parallel with the variable capacitance diode $D_3$ and the capacitor $D_{S1}$ connected in series therewith, constitute a single composite capacitor $C_{S3}$ which is connected in series with the oscillation coil $L_0$ so that such composite capacitor works as an element for determining tracking error in the high frequency region, more remarkably than the padding capacitor $C_{P0}$ which is connected in series with the oscillation coil $L_0$. The padding capacitor $C_{P0}$ has greater influence on the receiving frequency in the low region of the receiving frequency band. In the composite capacitor $C_{S3}$, the capacitor $C_{S2}$ is connected in parallel with the variable capacitance diode $D_3$ while the the capacitor $C_{S1}$ is connected in series therewith as mentioned above. Thus, with the circuit arrangement, the tracking error in the low receiving frequency band is improved mainly by the padding capacitor $C_{P0}$; the tracking error in the intermediate receiving frequency band is improved mainly by the capacitor $C_{S1}$; and the tracking error in the high receiving frequency band is improved by the capacitor $C_{S2}$ and variable capacitance diode $D_3$ in combination.

According to the present invention, the circuit constants are determined on the basis of such a concept as mentioned above. Tables 1 and 2 show examples of the circuit constants for the embodiment of FIG. 2.

TABLE 1

| (Circuit constants for the local oscillator circuit 2 of FIG. 2) | |
|---|---|
| $C_{P0}$ (pF) | 860.0 |
| $C_{S1}$ (pF) | 120.0 |
| $C_{S2}$ (pF) | 25.0 |
| $L_0$ (μH) | 78.4 |

(In this case, it is assumed that the capacitance of each of the variable capacitance diodes $D_1$ to $D_3$ is adjustable in the range of 447.4 pF to 28.0 pF.)

TABLE 2

| (Circuit constants for the radio-frequency tuning circuit 1 of FIG. 2) | |
|---|---|
| $C_1$ (pF) | 14.7 |
| $L_1$ (μH) | 203.2 |
| $C_0$ (pF) | 47000 |

Description will next be made of tracking errors which tend to occur in the electronic tuning circuit according to the present invention.

It is assumed that the capacitance of each of the variable capacitance diodes $D_1$ to $D_3$ is variable in the range from 30 to 384 pF in dependence on the applied voltage when it is attempted to receive the MW band (522 KHz to 1629 KHz). The capacitance of the local oscillator circuit 2 is determined, and thereafter the ratio of variations in the oscillation frequency is determined. A composite capacitance $C_0$ as viewed across the terminals of the oscillation coil $L_0$ of the local oscillator circuit 2 is given as follows:

$$CO = \frac{CPO(D2 + CS3)}{CPO + D2 + CS3} \quad (3)$$

$$CS3 = \frac{CS1(D3 + CS2)}{CS1 + D3 + CS2} \quad (4)$$

where $D_2$ and $D_3$ are the capacitances of the variable capacitance diodes; and $C_{S3}$ is the composite capacitance of the variable capacitance diode $D_3$ and capacitors $C_{S1}$, $C_{S2}$.

For the case where the capacitances of the variable capacitance diodes $D_2$, $D_3$ are of the minimum value, i.e., 30 pF and the case where such capacitances are of the maximum value, i.e., 384 pF, the oscillation frequency $f_1$ is sought in accordance with the following equation:

$$f1 = \frac{1}{2\pi \sqrt{LO\ CO}} \quad (5)$$

When the capacitance of each of the variable capacitance diodes $D_2$ and $D_3$ is 30 pF, the composite capacitance $C_{S3}$ is sought as 37.71 pF in accordance with the equation (4). The capacitance $C_0$ as viewed across the terminals of the oscillation coil $L_0$ turns out to be about 62.77 pF in accordance with the equation (3). Assuming that the stray capacitance of the oscillation coil $L_0$ is about 5 pF, then the oscillation frequency f1 max is given to be about 2184.5 KHz in accordance with the equation (5). Further, assuming that the capacitance of each of the variable capacitance diodes $D_2$ and $D_3$ is 384 pF, then the composite capacitance $C_{S3}$ is given to be about 96.62 pF in accordance with the equation (4). Thus, the capacitance $C_0$ as viewed across the terminals of the oscillation coil $L_0$ turns out to be about 305.48 pF in accordance with the equation (3). Assuming that the stray capacitance of the oscillation coil $L_0$ is 5 pF, then the oscillation frequency f1 min is sought to be 1018.5 KHz in accordance with the equation (5). In this way, the ratio of the variations in the tuning frequency is given as follows:

$$\frac{f1\ max}{f1\ min} = \frac{2184.5}{1018.5} = 2.14 \quad (6)$$

As will be appreciated from the equation (6), the ratio of variations in the oscillation frequency in the local oscillator circuit of the electronic tuning circuit according to the embodiment of FIG. 2 becomes equal to the frequency variation ratio as sought from the equation (2), i.e., about 2.14. This means that the tracking error is substantially zero.

Another example of circuit constants for the local oscillator circuit is is shown in Table 3.

TABLE 3

| (Circuit constants for the local oscillator circuit of FIG. 2) | |
|---|---|
| $C_{P0}$ (pF) | 750.0 |
| $C_{S1}$ (pF) | 110.0 |
| $C_{S2}$ (pF) | 20.0 |
| $L_0$ (μH) | 103.53 |

It will be apparent from Table 3 that if the inductance of the oscillation coil $L_0$ is changed, then the values for the other circuit contants should also be changed accordingly. With the electronic tuning circuit including the local oscillator circuit comprising such circuit constants as shown in Table 3, it is possible to reduce tracking error over a wide frequency range as shown at (f) in FIG. 7. Needless to say, the present invention is by no means limited to the use of the local oscillator circuit comprising such circuit constants as shown in Table 3. The variable capacitance diodes $D_1$ to $D_3$ may have identical characteristics. Obviously, if the characteristics of the variable capacitance diodes $D_2$ and $D_3$ are changed, then the remaining circuit constants should also be changed accordingly.

In FIG. 7, curves (d) to (g) represent tracking errors which tend to occur when the circuit constants for the components of the electronic tuning circuit of FIG. 2 are changed.

The oscillation frequency f0 is changed when the tuning voltage is applied to the variable capacitance diodes $D_2$ and $D_3$ of the local oscillator circuit 2. Assuming that the receiving frequency tuned at the radio-frequency tuning circuit 1 is f1, the the tracking error $f_E$ is given as follows:

$$f_E = f0 - f1 - 450 \text{ KHZ} \tag{7}$$

The tracking error $f_E$ of the circuit comprising such circuit contants as shown in Table 1 or 3 occurs based on the above equation (7), and it is shown by the curve (f) in FIG. 7. From the curve (f) of FIG. 7, it will be seen that the tracking error $f_E$ of the electronic tuning circuit according to the present invention is reduced over the entire receiving frequency band as compared with that of the conventional electronic tuning circuit shown by the curve (c).

It will now be explained what influences errors in the respective circuit constants of the radio-frequency tuning circuit 1 and local oscillator circuit 2 will have on tracking errors. In Table 3, the values for the padding capacitor $C_{P0}$ and oscillation coil $L_0$ are set up to represent errors of ±1% with respect to the values in Table 1, and the value for the capacitor $C_{S1}$ is set up to represent an error of ±2% with respect to the value in Table 1. In Table 4, the circuit constant for the capacitor $C_1$ of the radio-frequency tuning circuit 1 is set up to have an error ±2% with respect to that in Table 1. Further, Table 4 illustrates the case for dual-point adjustment, and Table 5 shows the case for single-point adjustment.

TABLE 4

(Circuit constants for the local oscillator circuit 2 of FIG. 2)

|  | (d) | (e) |
| --- | --- | --- |
| $C_{P0}$ (pF) | 851.4 | 868.6 |
| $C_{S1}$ (pF) | 122.4 | 117.6 |
| $C_{S2}$ (pF) | 24.5 | 25.5 |
| $L_0$ (μH) | 77.6 | 79.2 |

TABLE 5

(The tuning capacitor $C_1$ of the radio-frequency tuning circuit and the circuit constants for the local oscillator circuit 2 of FIG. 2)

|  | (g) | (h) |
| --- | --- | --- |
| $C_{P0}$ (pF) | 851.4 | 868.6 |
| $C_{S1}$ (pF) | 122.4 | 117.6 |
| $C_{S2}$ (pF) | 25.5 | 24.5 |
| $L_0$ (μH) | 79.2 | 77.6 |
| $C_1$ (pF) | 14.4 | 15.0 |

The circuit constants in the column (d) of Table 4 are the ones determined by adjusting the values for the tuning coil $L_1$ and tuning capacitor $C_1$ of the radio-frequency tuning circuit 1 so that the tracking error becomes zero at two points, i.e., at 600 KHz and 1400 KHz. The tracking error curve is shown at (d) in FIG. 7. For the circuit constants shown in the column (e) of Table 4, the tracking error is distributed in the range of ±2 KHz as shown at (e) in FIG. 7.

When the circuit constants are set up as shown in the column of Table 5 by adjusting only the tuning coil $L_1$ of the radio-frequency tuning circuit 1 only at the tracking adjusting point of 600 KHz, such as tracking error curve shown at (g) in FIG. 7 is obtained; and when the circuit constants are set up as shown in the column (h) in Table 5, such a tracking error curve as shown at (h) in FIG. 7 is obtained.

As will be appreciated from the above discussion, with the electronic tuning circuit for AM receiver according to the present invention, it is possible to effect adjustment either at two points or one point in the receiving frequency band. Furthermore, by making the tolerance for each circuit constant of the local oscillator circuit 2 to be be within the range of ±1%, it is possible to make the tracking error closer to zero over the receiving frequency range of 500 KHz to 1700 KHz.

Thus, it will be appreciated that the present invention provides an improved electrnic tuning circuit which is well suitable for AM stereo receiver and free from such problems as deterioration in stereo separation, distortion or the like.

Furthermore, according to the present invention stray capacitance can be decreased by connecting the bias resistor for the local oscillator circuit in series therewith, and thus the tracking error can be further reduced. Another advantage is such that the number of components for the local oscillator circuit can be reduced so that the stray capacitance of thereof can be reduced. Thus, since there is no need to use a trimmer capacitor which has heretofore commonly been used, a chip capacitor can be used so that the electronic tuning circuit can be miniaturized. In this way, the electronic tuning circuit for AM receiver according to the present invention can be manufactured at low cost.

While the present invention has been illustrated and described with respect to specific embodiments thereof, it is to be understood that the present invention is by no means limited thereto but encompasses all modications and changes which will become possible within the scope of the appended claims.

I claim:

1. An electronic tuning circuit for an AM receiver including a radio-frequency tuning circuit and a local oscillator circuit each of which uses a variable capacitance diode as tuning element, said local oscillator circuit comprising an oscillation coil, a padding capacitor connected in series with said oscillation coil, a first variable capacitance diode connected in series with said oscillation coil, a second variable capacitance diode having a cathode connected in common to the cathode of said first variable capacitance diode, said first and second variable capacitance diodes having grounded anodes, a first fixed capacitance element connected to the anodes of said first and second variable capacitance diodes, and a second fixed capacitance element connected in parallel with said second variable capacitance diode.

2. An electronic tuning circuit for an AM receiver including a radio-frequency tuning circuit and a local oscillator circuit each of which uses a variable capacitance diode as tuning element, said local oscillator circuit comprising an oscillation coil; a padding capacitor connected at one end to said oscillation coil; a first and a second variable capacitance diode which are connected to the other end of said padding capacitor; a bias resistor and a first fixed capacitance element which are connected to a connection point between the anode of said second variable capacitance diode and a second fixed capacitance element connected in parallel with said second variable capacitance diode, said first fixed capacitance element, said bias resistor, said first variable capacitance diode, and said oscillation coil being grounded at the other ends thereof.

3. An electronic tuning circuit for an AM receiver including a radio-frequency tuning circuit and a local oscillator circuit each of which uses a variable capacitance diode as tuning element, said local oscillator circuit comprising an oscillation coil grounded at one end; a padding capacitor connected to the other end of said oscillation coil; a first variable capacitance diode and a first fixed capacitance element which are connected to the other end of said padding capacitor; a second variable capacitance diode and a second fixed capacitance element which are connected to the other end of said first fixed capacitance element; the cathodes of said first and second variable capacitance diodes and the other end of said second fixed capacitance element being AC-wise grounded through a third fixed capacitance element; and a first and a second bias resistor connected to the anodes of said first and second variable capacitance diodes respectively, a tuning voltage being applied to the cathodes of said first and second variable capacitance diodes.

4. An electronic tuning circuit for an AM receiver including a radio-frequency tuning circuit and a local oscillator circuit each of which uses a variable capacitance diode as tuning element, said local oscillator circuit comprising an oscillation coil; a padding capacitor through which said oscillation coil is grounded at one end; a first variable capacitance diode and a first fixed capacitance element which are connected to the other end of said oscillation coil; a second variable capacitance diode and a second fixed capacitance element which are connected to the other end of said first fixed capacitance element; the cathodes of said first and second variable capacitance diodes and the other end of said second fixed capacitance element being AC-wise grounded through a third fixed capacitance element; and a first and a second bias resistor connected to the anodes of said first and second variable capacitance diodes respectively, a tuning voltage being applied to the cathodes of said first and second variable capacitance diodes.

5. An electronic tuning circuit for an AM receiver including a radio-frequency tuning circuit and a local oscillator circuit each of which uses a variable capacitance diode as tuning element, said local oscillator circuit comprising an oscillation coil grounded at one end thereof; a first variable capacitance diode and a first fixed capacitance element which are connected to the other end of said oscillation coil; a second variable capacitance diode and a second fixed capacitance element which are connected to the other end of said first fixed capacitance element, said first and second variable capacitance diodes and said second fixed capacitance element being AC-wise grounded at their other ends; and a bias resistor connected to the anode of said second variable capacitance diode, a tuning voltage being applied to a connection point between the cathodes of said first and second variable capacitance diodes and said second fixed capacitance element.

6. An electronic tuning circuit for an AM receiver including a radio-frequency tuning circuit and a local oscillator circuit use, respectively, a first and a second variable capacitance diode as tuning elements, a padding capacitor connected to one end of an oscillation coil of said local oscillator circuit; said second variable capacitance diode being connected between the other end of said padding capacitor and the other end of said oscillation coil in a direction reverse to the polarity of a tuning voltage applied to said radio-frequency tuning circuit and said local oscillator circuit; one end of a first capacitor and the cathode of a third variable capacitance diode being connected to the cathode of said second variable capacitance diode; the anode of said third variable capacitance diode and the other end of said first capacitor being connected together; a second capacitor and a bias resistor being connected in parallel with each other, a connection point between said second capacitor and said bias resistor being connected to a connection point between said third variable capacitance diode and said first capacitor, and another connection point between said second capacitor and said bias resistor being connected to the other end of said second variable capacitance diode.

* * * * *